United States Patent
Chang et al.

(10) Patent No.: US 10,483,437 B2
(45) Date of Patent: Nov. 19, 2019

(54) DISPLAY DEVICE

(71) Applicant: InnoLux Corporation, Miao-Li County (TW)

(72) Inventors: Chih-I Chang, Miao-Li County (TW); Ching-Pao Wang, Miao-Li County (TW)

(73) Assignee: INNOLUX CORPORATION, Chu-Nan, Miao-Li County (TW)

( * ) Notice: Subject to any disclaimer, the term of this patent is extended or adjusted under 35 U.S.C. 154(b) by 0 days.

(21) Appl. No.: 16/158,832

(22) Filed: Oct. 12, 2018

(65) Prior Publication Data

US 2019/0165217 A1    May 30, 2019

(30) Foreign Application Priority Data

Nov. 28, 2017 (CN) .......................... 2017 1 1220035

(51) Int. Cl.
*H01L 33/48* (2010.01)
*H01L 51/52* (2006.01)

(52) U.S. Cl.
CPC ........ *H01L 33/483* (2013.01); *H01L 51/5246* (2013.01)

(58) Field of Classification Search
CPC .................... H01L 33/483; H01L 51/5246
See application file for complete search history.

(56) References Cited

U.S. PATENT DOCUMENTS

| | | | | |
|---|---|---|---|---|
| 2002/0036460 A1* | 3/2002 | Takenaka | ................ | H01J 9/185 313/495 |
| 2010/0321758 A1* | 12/2010 | Bugno | .................... | B60R 1/088 359/267 |
| 2011/0199348 A1* | 8/2011 | Takatani | ............. | G02F 1/13452 345/204 |
| 2014/0192272 A1* | 7/2014 | Kang | .................. | G02F 1/13338 349/12 |
| 2015/0115413 A1* | 4/2015 | Rudmann | ......... | H01L 27/14618 257/622 |
| 2017/0125726 A1* | 5/2017 | Hwang | ............... | H01L 51/5246 |
| 2018/0031934 A1* | 2/2018 | Watanabe | ................ | B32B 7/12 |
| 2018/0033969 A1* | 2/2018 | Kamijo | ................ | G02F 1/1345 |

* cited by examiner

*Primary Examiner* — Victor A Mandala
(74) *Attorney, Agent, or Firm* — Muncy, Geissler, Olds & Lowe, PC

(57) ABSTRACT

A display device includes: a display panel including a first substrate with a first surface and a second substrate disposed on the first surface; a third substrate, wherein the second substrate is disposed between the first substrate and the third substrate, and the third substrate has a second surface facing the first surface; an adhesion element disposed on the first surface and adjacent to the second substrate, wherein the adhesion element has a first through hole; and a filler disposed in the first through hole and in contact with the first surface and the second surface. The first through hole of the adhesion element has an area defined as a first area, the filler has a region in contact with the second surface, and an area of the region is defined as a second area. The ratio of the first area to the second area ranges from 0.5 to 0.99.

20 Claims, 6 Drawing Sheets

DISPLAY DEVICE

CROSS REFERENCE TO RELATED APPLICATION

This application claims the benefits of the Chinese Patent Application Serial Number 201711220035.6, filed on Nov. 28, 2017, the subject matter of which is incorporated herein by reference.

BACKGROUND OF THE INVENTION

1. Field

The present disclosure relates to a display device and more particularly to a display device with a specially designed adhesion element.

2. Description of Related Art

A typical display device may use an adhesion element or adhesive to bond its display panel to a glass cover. When an adhesion element is used for bonding, it is required that the adhesion element matches the display panel in question; that is to say, different display panels call for different adhesion elements, which nevertheless adds to the complexity or cost of production. If adhesive is used instead, the fluidity of adhesive makes it difficult to control the amount of the adhesive being used and thus causes trouble to manufacture. For example, adhesive may overflow to the display panel it is applied to, or a poor bond may be formed that leads to breakage of the display panel.

It is therefore imperative to develop a display device whose display panel and glass cover can be bonded in a more efficient way that reduces not only the risk of breakage of the display panel, but also the cost or time required for production.

SUMMARY

In view of the above, the present disclosure uses an adhesion element with a through hole to control the bonding location and amount of adhesive, to thereby enhance the bonding efficiency, or to simplify the manufacture of the display device.

To achieve the aforesaid objective, the present disclosure provides a display device that includes: a display panel including a first substrate and a second substrate, wherein the first substrate has a first surface, and the second substrate is disposed on the first surface; a third substrate such that the second substrate is disposed between the first substrate and the third substrate, wherein the third substrate has a second surface facing the first surface; an adhesion element disposed on the first surface and adjacent to the second substrate, wherein the adhesion element has a first through hole; and a filler disposed in the first through hole and in contact with the first surface and the second surface. The first through hole of the adhesion element has an area defined as a first area, the filler has a region in contact with the second surface, an area of the region is defined as a second area, and a ratio of the first area to the second area ranges from 0.5 to 0.99.

The present disclosure also provides a display panel that includes: a first substrate having a first surface; a second substrate disposed on the first surface; a third substrate such that the second substrate is disposed between the first substrate and the third substrate, wherein the third substrate has a second surface facing the first surface; an adhesion element disposed on the first surface and adjacent to the second substrate, wherein the adhesion element has a first through hole; and a filler disposed in the first through hole and in contact with the first surface and the second surface. The first through hole of the adhesion element has an area defined as a first area, the filler has a region in contact with the second surface, an area of the region is defined as a second area, and a ratio of the first area to the second area ranges from 0.5 to 0.99.

DETAILED DESCRIPTION OF THE PREFERRED EMBODIMENT

Specific embodiments are described below to demonstrate how to implement the present disclosure so that, based on the disclosure of this specification, a person skilled in the art can easily understand other advantages and effects of the present disclosure. The present disclosure can be implemented or applied in ways different from those demonstrated by the embodiments. All the details in the specification can be modified or changed to meet different points of view or applications without departing from the spirit of the invention.

Furthermore, the ordinal numbers used in the specification and the appended claims such as "first", "second", and "third" serve only to modify the claimed elements immediately after them and do not imply that such a claimed element has a counterpart with a previous ordinal number, that there is a certain order between such claimed elements, or that such claimed elements are sequentially used in a manufacturing process. The ordinal numbers are used only to provide a clear distinction between claimed elements having the same name.

In addition, the term "on" as used in the specification and the claims to refer to the position of one element in relation to another may refer to direct or indirect contact between the two elements.

Figure 1:
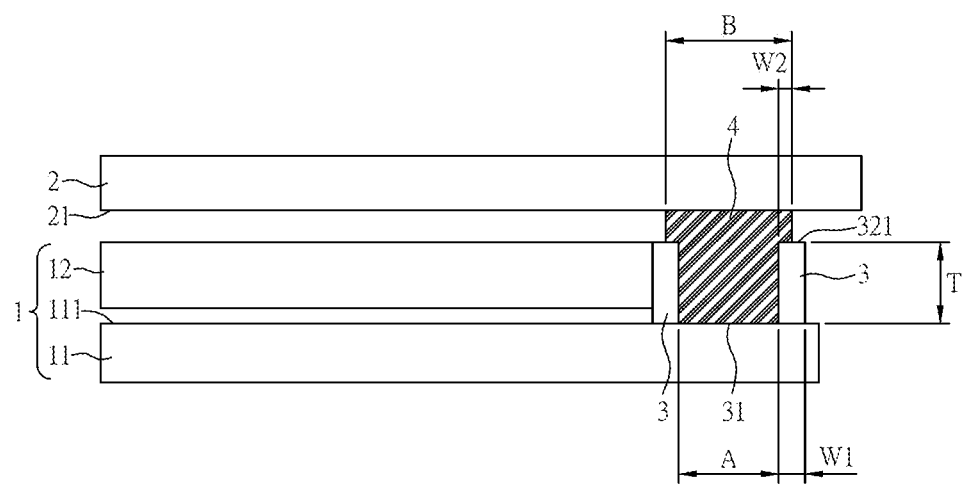
FIG. 1 is a sectional view of the display device in an embodiment of the present disclosure.
Figure 2:
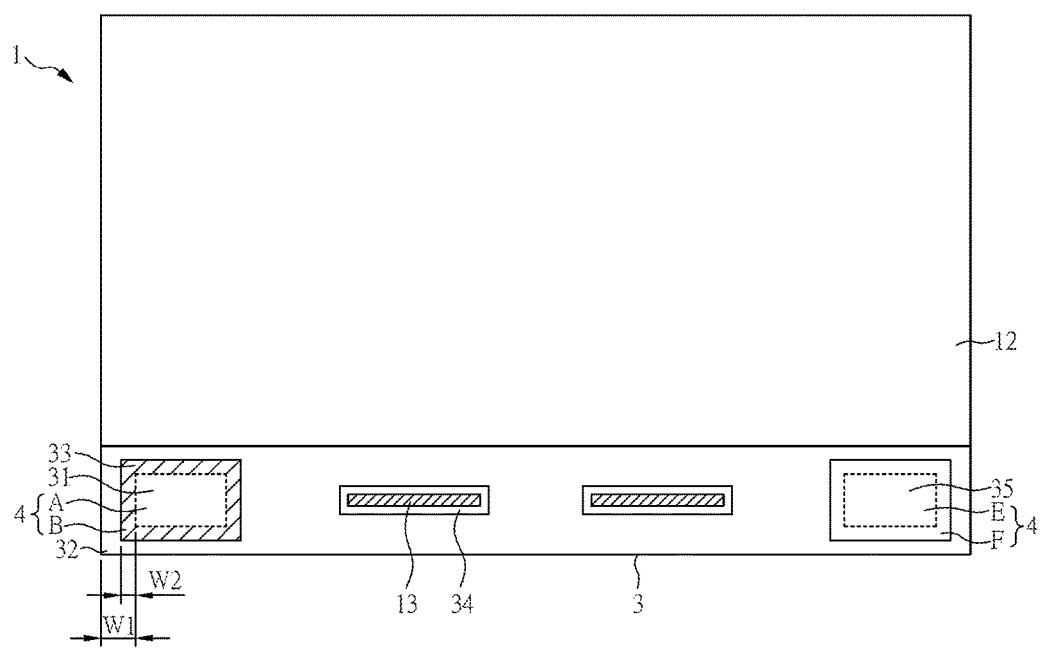
FIG. 2 is a partial top view of the display device in FIG. 1.

Please refer to FIG. 1 for a sectional view of the display device in an embodiment of the present disclosure and FIG. 2 for a top view of a portion of the display device. The disclosed display device includes: a display panel 1 including a first substrate 11 and a second substrate 12, wherein the first substrate 11 has a first surface 111, and the second substrate 12 is disposed on the first surface 111; a third substrate 2 such that the second substrate 12 is disposed between the first substrate 11 and the third substrate 2, wherein the third substrate 2 has a second surface 21 facing the first surface 111; an adhesion element 3 disposed on the first surface 111 and adjacent to the second substrate 12, wherein the adhesion element 3 has a first through hole 31; and a filler 4 disposed in the first through hole 31 and in contact with the first surface 111 and the second surface 21. As shown in the top view of FIG. 2, the first through hole 31 of the adhesion element 3 has an area (i.e., the area of the region enclosed by the dashed line) defined as a first area A, the filler 4 has a region in contact with the second surface 21, and an area of the region (i.e., the area of the region enclosed by the solid line) is defined as a second area B. The ratio of the first area A to the second area B ranges from 0.5 to 0.99. In one embodiment of the present disclosure, the ratio of the first area A to the second area B ranges from 0.85 to 0.99.

The present disclosure does not impose particular limitation on the location of the first through hole 31. The first through hole 31 may correspond in position to, for example but not limited to, a central portion, an edge, or a corner of the first substrate 11. In one embodiment of the present disclosure, the first through hole 31 corresponds in position to an edge or corner of the first substrate 11 in order not to reduce the structural strength, and thereby lead to breakage, of the display panel 1. The thickness of the first substrate 11 may be 0.2 mm or 0.15 mm but is not limited thereto. With continued reference to FIG. 2, the first through hole 31 is enclosed by a through-hole sidewall 32, and the through-hole sidewall 32 has a first smallest width W1 ranging from 0.1 μm to 2 μm, but is not limited thereto.

In this embodiment of the present disclosure, the through-hole sidewall 32 has a third surface 321 facing the third substrate 2. The first through hole 31 is located at the center of the third surface 321. The filler 4 is in contact with the third surface 321. The adhesion element 3 includes an overlap region 33, in which the filler 4 covers the third surface 321. The overlap region 33 has a second smallest width W2, and the ratio of the second smallest width W2 to the first smallest width W1 ranges from 0 to 0.5. In one embodiment of the present disclosure, the second smallest width W2 ranges from 0.01 μm to 1 μm, such as from 0.1 μm to 0.5 μm, but is not limited thereto.

The present disclosure does not impose particular limitation on the material of the adhesion element 3; the adhesion element 3 may be any adhesive material. There is no particular limitation on the thickness T of the adhesion element 3 either. The thickness T of the adhesion element 3 may be adjusted according to the distance from the first substrate 11 to the third substrate 2 or the thickness of the second substrate 12. For example, the thickness T of the adhesion element 3 may be, but is not limited to, 0.01 μm to 1 μm. In one embodiment of the present disclosure, the thickness T of the adhesion element 3 ranges from 0.01 μm to 0.7 μm. The material of the filler 4 is subject to no particular limitation either, provided that the filler 4 can bond the first substrate 11 and the third substrate 2 together. The filler 4 may be, for example but not limited to, silicone or other polymeric adhesives.

When adhesive (i.e., the filler in the present disclosure) is used in the prior art to bond the display panel and glass cover of a display device, the amount of the adhesive being used is difficult to control due to the fluidity of the adhesive; as a result, the adhesive may overflow to the display panel, or the display panel may break because the bond is poorly formed. According to the present disclosure, by contrast, the location and amount of the filler 4 can be effectively controlled by disposing the filler 4 in the first through hole 31 of the adhesion element 3. Moreover, as the filler 4 fills up the first through hole 31 when the first substrate 11 and the third substrate 2 are bonded together, a large area of contact between the filler 4 and the first substrate 11 and/or the third substrate 2 is ensured, which enhances the bonding efficiency of the first substrate 11 and the third substrate 2. When the third substrate 2 is a glass substrate, this large area of contact between the filler 4 and the first substrate 11 and/or the third substrate 2 helps reduce the risk of breakage of the first substrate 11 in the corners.

In one embodiment of the present disclosure, the display panel 1 further includes an electronic element 13 disposed on the first substrate 11, the adhesion element 3 has a second through hole 34, and the electronic element 13 is disposed in the second through hole 34. The present disclosure does not impose particular limitation on the electronic element 13. The electronic element 13 may be, for example but not limited to, a transistor, an integrated circuit (IC), or a flexible printed circuit board. In one embodiment of the present disclosure, the thickness T of the adhesion element 3 is greater than the thickness of the electronic element 13 such that, in addition to enabling control over the filler 4 through the first through hole 31, the adhesion element 3 protects the electronic element 13 from direct contact with, and hence damage by or because of, the third substrate 2.

Figure 3:
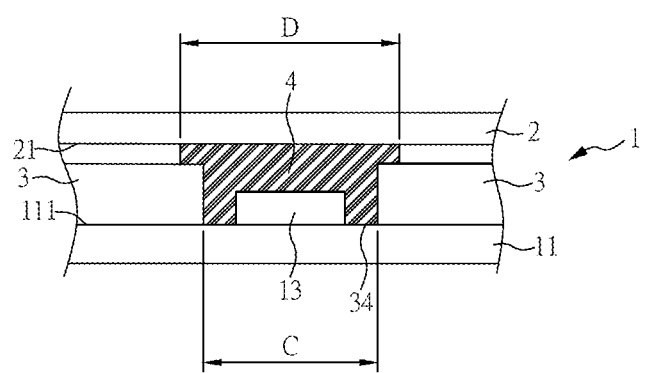
FIG. 3 is a partial sectional view of the display device in another embodiment of the present disclosure.

FIG. 3 is a sectional view of a portion of the display device in another embodiment of the present disclosure. The display panel in FIG. 3 is similar to that in FIG. 1 and FIG. 2. As shown in FIG. 3, the electronic element 13 is disposed on the first substrate 11 and in the second through hole 34. However, the filler 4 in this embodiment is also disposed in the second through hole 34, and the filler 4 in the second through hole 34 is in contact with the first surface 111 and the second surface 21. The second through hole 34 of the adhesion element 3 has an area defined as a third area C, the filler 4 in the second through hole has a region in contact with the second surface 21, and an area of the region corresponding to the second through 34 is defined as a fourth area D. The ratio of the third area C to the fourth area D ranges from 0.5 to 0.99. In one embodiment of the present disclosure, the ratio of the third area C to the fourth area D ranges from 0.85 to 0.99. The configuration shown in FIG. 3 not only increases the area of contact between the filler 4 and the first substrate 11 and/or the third substrate 2 and consequently the bonding efficiency of the first substrate 11 and the third substrate 2, but also allows the filler 4 to protect the electronic element 13 from dust or other pollutants.

Referring back to FIG. 2, the adhesion element 3 in one embodiment of the present disclosure further includes a third through hole 35. The first through hole 31 and the third through hole 35 are located at two corresponding ends of the adhesion element 3 respectively. The filler 4 is disposed in the third through hole 35 too, and the filler 4 in the third through hole 35 is in contact with the first surface 111 and the second surface 21. The third through hole 35 of the adhesion element 3 has an area (i.e., the area of the region enclosed by the dashed line) defined as a fifth area E, the filler 4 has a region in contact with the second surface 21, and an area of the region corresponding to the third through hole 35 (i.e., the area of the region enclosed by the solid line) is defined as a sixth area F. The ratio of the fifth area E to the sixth area F ranges from 0.5 to 0.99. In one embodiment of the present disclosure, the ratio of the fifth area E to the sixth area F ranges from 0.85 to 0.99.

Figure 4A:
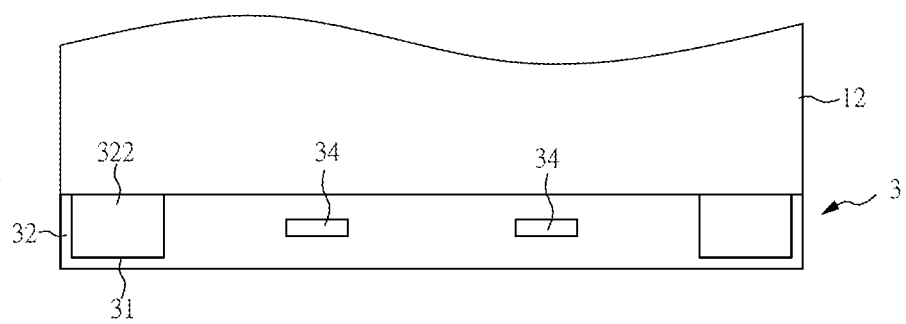
FIG. 4A and FIG. 4B are partial top views of the display devices in another two embodiments of the present disclosure respectively.
Figure 4B:
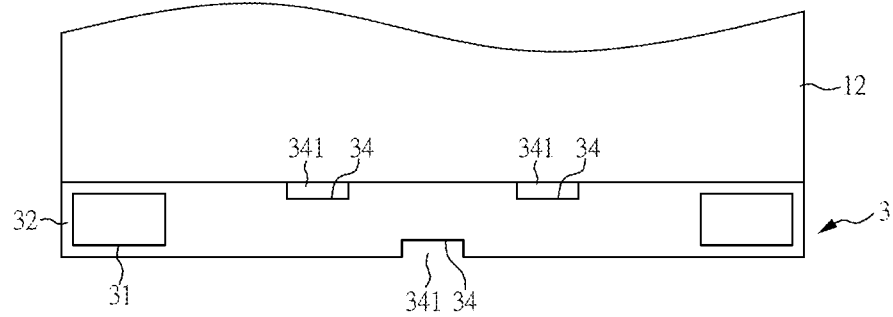
Figure 4C:
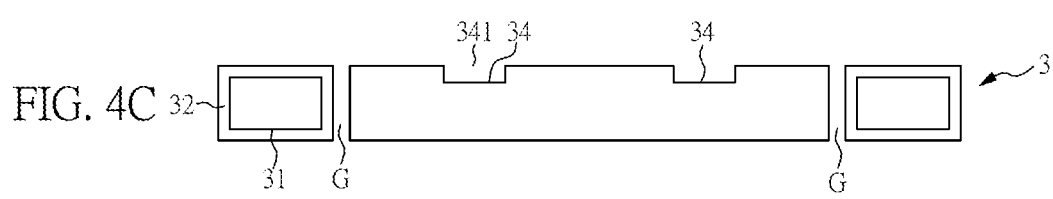
FIG. 4C and FIG. 4D are top views of the adhesion elements in still another two embodiments of the present disclosure respectively.
Figure 4D:
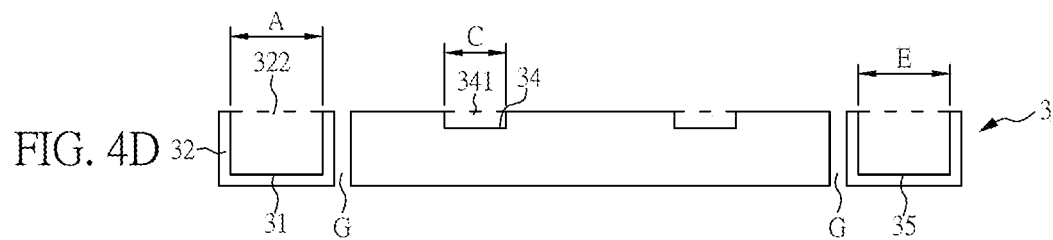

FIG. 4A and FIG. 4B are partial top views of the display devices 1 in another two embodiments of the present disclosure respectively. The adhesion element 3 in FIG. 4A is similar to the adhesion element 3 in FIG. 2, except for the following difference. The first through hole 31 of the adhesion element 3 in FIG. 4A includes an opening 322 facing the second substrate 12. The adhesion element 3 in FIG. 4B is similar to adhesion element 3 in FIG. 2, except for the following difference. Each second through hole 34 in FIG. 4B includes an opening 341. In view of a normal direction of the first surface of the first substrate, each opening 341 may face or face away from the second substrate 12. There is no particular limitation on the direction of each opening 341, the direction of the opening may be not perpendicular to a side surface of the second substrate. FIG. 4C and FIG. 4D are top views of the adhesion elements 3 in still another two embodiments of the present disclosure respectively. The adhesion element 3 in FIG. 4C is similar to the adhesion element 3 in FIG. 4B, except for the following difference. The through-hole sidewall 32 in FIG. 4B is integrally formed with the adhesion element 3. The adhesion element 3 in FIG. 4C can be separated into at least two parts, and there is a distance G between two parts. The adhesion element 3 in FIG. 4D is similar to the adhesion element 3 in FIG. 4A, except for the following difference. The second through hole 34 in FIG. 4D includes an opening 341, which may face or face away from the second substrate 12 without limitation; and that the through-hole sidewall 32 in FIG. 4A is integrally formed with the adhesion element 3. In FIG. 4D, the first area A is the area surrounded by the three sides of the through-hole sidewall 32 of the first through hole 31, the third area C is the area surrounded by the three sides of the through-hole sidewall 32 of the second through hole 34, and the fifth area E is the area surrounded by the three sides of the through-hole sidewall 32 of the third through hole 35. The adhesion element 3 in each of FIG. 4A to FIG. 4D can be used in the display device in FIG. 1, but the present disclosure is not limited to any of such configurations. The features of the foregoing embodiments of the present disclosure can be combined as needed to form another embodiment. In the present disclosure, the openings 322, 341 can be optionally disposed.

Figure 5:
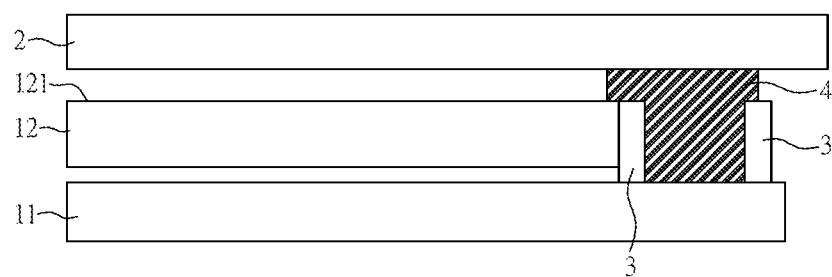
FIG. 5 is a sectional view of the display device in yet another embodiment of the present disclosure.

FIG. 5 is a sectional view of the display device in another embodiment of the present disclosure. The display device in FIG. 5 is similar to the display device in FIG. 1, except for the following difference. The second substrate 12 in FIG. 5 has a fourth surface 121 facing the third substrate 2, and that the filler 4 is in contact with the fourth surface 121. The adhesion element 3 in FIG. 5 may be identical to the adhesion element 3 in FIG. 2 or FIG. 3 or be any one of the adhesion element 3 in FIG. 4A to FIG. 4D.

Figure 6:
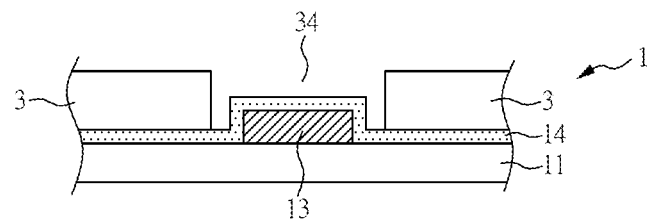
FIG. 6 is a partial sectional view of the display device in a further embodiment of the present disclosure.

FIG. 6 is a sectional view of a portion of the display device in another embodiment of the present disclosure. The display device in FIG. 6 is similar to the display device in FIG. 3, except for the following difference. The display panel 1 in FIG. 6 further includes an adhesive layer 14 disposed on both the first substrate 11 and the electronic device 13, and that the adhesion element 3 is disposed on the adhesive layer 14. The adhesive layer 14 may be a TUFFY coating or a silicone-based adhesive; the present disclosure has no limitation in this regard.

According to the above, the display device disclosed herein is so designed that the filler 4 is disposed in the first through hole 31 of the adhesion element 3 to enable effective control of the location and amount of the filler 4, and that when the first substrate 11 and the third substrate 2 are bonded together, the filler 4 fills up the first through hole 31 to achieve a large area of contact between the filler 4 and the first substrate 11 and/or the third substrate 2 and therefore high bonding efficiency of the first substrate 11 and the third substrate 2.

The disclosed display device can be implemented as various displays, such as those including organic light-emitting diodes (OLEDs), quantum dots (QDs), fluorescence molecules, phosphors, light-emitting diodes (LEDs), or micro light-emitting diodes (micro LEDs) as the display medium. The disclosed display device can also be implemented as a touch-controlled display with a touchscreen. Besides, the disclosed display device can be implemented as a flat, curved, or flexible display with or without a touchscreen.

The specific embodiments described above should be construed as explanatory only and are by no means restrictive of the remainder of the present disclosure.

What is claimed is:

1. A display device, comprising:
a display panel comprising:
a first substrate having a first surface; and
a second substrate disposed on the first surface;
a third substrate such that the second substrate is disposed between the first substrate and the third substrate, wherein the third substrate has a second surface facing the first surface;
an adhesion element disposed on the first surface and adjacent to the second substrate, wherein the adhesion element has a first through hole; and
a filler disposed in the first through hole and in contact with the first surface and the second surface;
wherein the first through hole of the adhesion element has an area defined as a first area, the filler has a region in contact with the second surface, an area of the region is defined as a second area, and a ratio of the first area to the second area ranges from 0.5 to 0.99.

2. The display device of claim 1, wherein the ratio of the first area to the second area ranges from 0.85 to 0.99.

3. The display device of claim 1, wherein the adhesion element has a third surface facing the third substrate, and the filler is in contact with the third surface.

4. The display device of claim 1, wherein in view of a normal direction of the first surface of the first substrate, the first through hole comprises an opening facing the second substrate.

5. The display device of claim 1, wherein the second substrate has a fourth surface facing the third substrate, and the filler is in contact with the fourth surface.

6. The display device of claim 1, wherein the display panel further comprises an electronic element disposed on the first surface, the adhesion element further has a second through hole, and the electronic element is disposed in the second through hole.

7. The display device of claim 6, wherein the filler is disposed in the second through hole and is in contact with the first surface and the second surface, the second through hole of the adhesion element has an area defined as a third area, the filler in the second through hole has a region in contact with the second surface, an area of the region corresponding to the second through hole is defined as a fourth area, and a ratio of the third area to the fourth area ranges from 0.5 to 0.99.

8. The display device of claim 7, wherein the ratio of the third area to the fourth area ranges from 0.85 to 0.99.

9. The display device of claim 6, wherein the display panel further comprises an adhesive layer, and the adhesive layer is disposed on the first substrate and the electronic element.

10. The display device of claim 9, wherein the adhesion element is disposed on the adhesive layer.

11. The display device of claim 1, wherein the thickness of the adhesion element ranges from 0.01 µm to 1 µm.

12. The display device of claim 1, wherein the adhesion element comprises a third through hole, the first through hole and the third through hole are located at two corresponding ends of the adhesion element respectively, the filler is disposed in the third through hole, the filler in the third through hole is in contact with the first surface and the second surface, the third through hole of the adhesion element has an area defined as a fifth area, the filler in the third through hole has a region in contact with the second surface, an area of the region corresponding to the third through hole is defined as a sixth area, and a ratio of the fifth area to the sixth area ranges from 0.5 to 0.99.

13. The display device of claim 12, wherein the ratio of the fifth area to the sixth area ranges from 0.85 to 0.99.

14. The display device of claim 1, wherein the first through hole is enclosed by a through-hole sidewall.

15. The display device of claim 14, wherein the through-hole sidewall has a first smallest width, and the first smallest width ranges from 0.1 µm to 2 µm.

16. The display device of claim 15, wherein the adhesion element has a third surface facing the third substrate, the filler is in contact with the third surface in an overlap region which has a second smallest width, and a ratio of the second smallest width to the first smallest width ranges from 0 to 0.5.

17. The display device of claim 14, wherein the through-hole side wall and the adhesion element are integrally formed.

18. A display panel, comprising:
a first substrate, having a first surface;
a second substrate, disposed on the first surface;
a third substrate, wherein the second substrate is disposed between the first substrate and the third substrate, and the third substrate has a second surface facing the first surface;
an adhesion element, disposed on the first surface and adjacent to the second substrate, wherein the adhesion element has a first through hole; and
a filler, disposed in the first through hole and in contact with the first surface and the second surface;
wherein the first through hole of the adhesion element has an area defined as a first area, the filler has a region in contact with the second surface, an area of the region is defined as a second area, and a ratio of the first area to the second area ranges from 0.5 to 0.99.

19. The display panel of claim 18, wherein the ratio of the first area to the second area ranges from 0.85 to 0.99.

20. The display device of claim 18, wherein the adhesion element has a third surface facing the third substrate, and the filler is in contact with the third surface.

* * * * *